United States Patent
Cadag et al.

(10) Patent No.: US 9,953,933 B1
(45) Date of Patent: Apr. 24, 2018

(54) FLOW OVER WIRE DIE ATTACH FILM AND CONDUCTIVE MOLDING COMPOUND TO PROVIDE AN ELECTROMAGNETIC INTERFERENCE SHIELD FOR A SEMICONDUCTOR DIE

(71) Applicant: STMicroelectronics, Inc., Calamba (PH)

(72) Inventors: Aaron Cadag, Calamba (PH); Rennier Rodriguez, Bulacan (PH); Ela Mia Cadag, Calamba (PH)

(73) Assignee: STMICROELECTRONICS, INC., Calamba (PH)

( * ) Notice: Subject to any disclaimer, the term of this patent is extended or adjusted under 35 U.S.C. 154(b) by 0 days.

(21) Appl. No.: 15/474,904

(22) Filed: Mar. 30, 2017

(51) Int. Cl.
*H01L 23/552* (2006.01)
*H01L 23/00* (2006.01)
*B32B 7/12* (2006.01)
*H01L 21/78* (2006.01)
*H01L 23/498* (2006.01)
(Continued)

(52) U.S. Cl.
CPC .............. *H01L 23/552* (2013.01); *B32B 7/12* (2013.01); *H01L 21/4853* (2013.01); *H01L 21/561* (2013.01); *H01L 21/78* (2013.01); *H01L 23/3128* (2013.01); *H01L 23/3135* (2013.01); *H01L 23/49811* (2013.01); *H01L 23/49816* (2013.01); *H01L 24/29* (2013.01); *H01L 24/48* (2013.01); *H01L 24/85* (2013.01); *H01L 24/97* (2013.01); *B32B 2457/14* (2013.01); *H01L 2224/32225* (2013.01); *H01L 2224/48091* (2013.01); *H01L 2224/48229* (2013.01);
(Continued)

(58) Field of Classification Search
None
See application file for complete search history.

(56) References Cited

U.S. PATENT DOCUMENTS

2009/0001599 A1 1/2009 Foong et al.
2012/0115277 A1* 5/2012 Lee ..................... H01L 21/561
438/107
(Continued)

OTHER PUBLICATIONS

Lintec of America, Inc., "Dicing Die Bonding Tape," URL= http://www.lintec-usa.com/di_b.cfm, download date Feb. 9, 2017, 3 pages.
(Continued)

*Primary Examiner* — Whitney T Moore
(74) *Attorney, Agent, or Firm* — Seed IP Law Group LLP

(57) ABSTRACT

A semiconductor package includes a substrate, a die, an insulating die attach film, a dummy die, a conductive layer, and an electrically conductive molding compound or encapsulant. The first surface of the substrate includes a plurality of internal leads, and the second surface of the substrate includes a plurality of external electrically conductive pads and an electrically conductive ground terminal. A non-conductive flow over wire die attach film is placed to surround and encase the die. The dummy die overlies the die and a conductive layer overlies the dummy die. The electrically conductive molding compound is formed to encase the various components of the semiconductor device. The electrically conductive molding compound is electrically coupled to the electrically conductive ground terminal and the conductive layer forming an EMI shield for the die in the package.

19 Claims, 9 Drawing Sheets

(51) Int. Cl.
  *H01L 23/31* (2006.01)
  *H01L 21/56* (2006.01)
  *H01L 21/48* (2006.01)

(52) U.S. Cl.
  CPC ............... *H01L 2224/48992* (2013.01); *H01L 2924/15311* (2013.01); *H01L 2924/3025* (2013.01)

(56) References Cited

U.S. PATENT DOCUMENTS

| | | | | |
|---|---|---|---|---|
| 2015/0129874 A1* | 5/2015 | Choi | ............... | H01L 23/552 257/48 |
| 2015/0294940 A1* | 10/2015 | Fay | ............... | H01L 23/5386 257/777 |

OTHER PUBLICATIONS

"Die Attach Film for FOD (Film Over Die) Application," Sep. 24, 2016, URL= http://dieattachfilm.com/2016/09/24/die-attach-film-for-fod-film-over-die-application/, download date Feb. 9, 2017, 2 pages.

Gotro, "Polymers Hard at Work in Your Smart Phone" *Orange County & Southern California Sections of AIChE Joint Dinner Meeting*, Long Beach, California, USA, Jul. 20, 2010, 38 pages.

\* cited by examiner

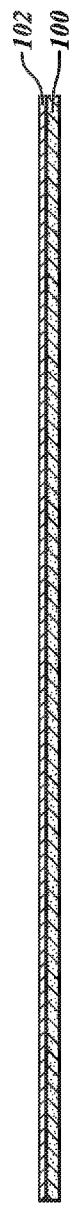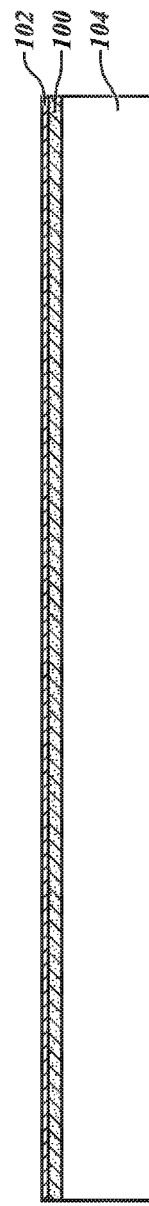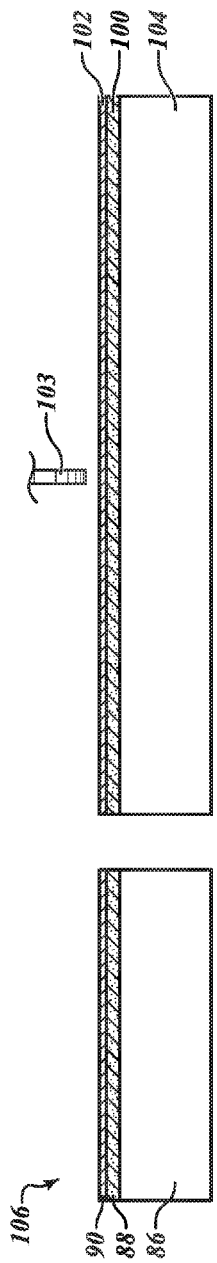

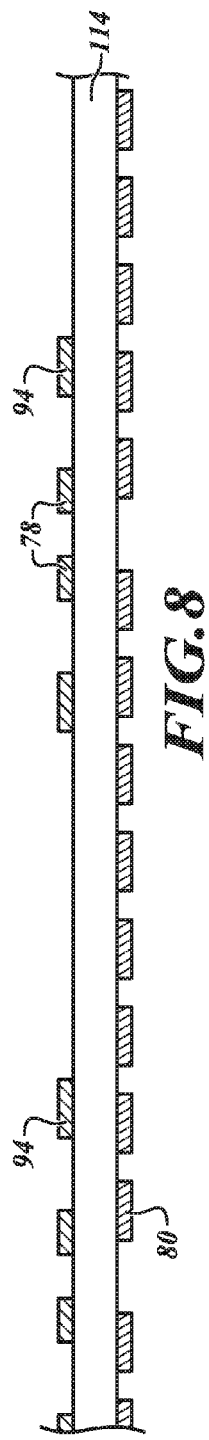
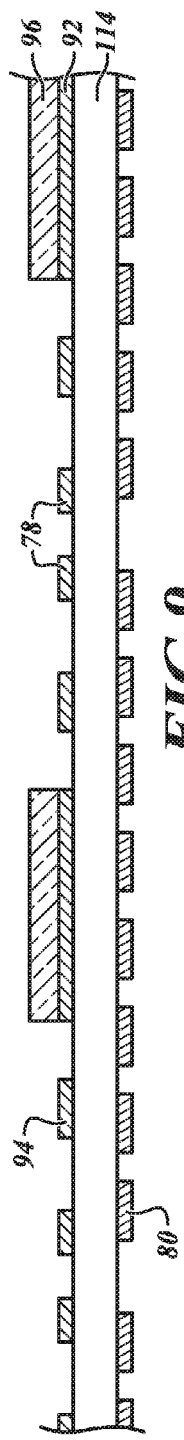
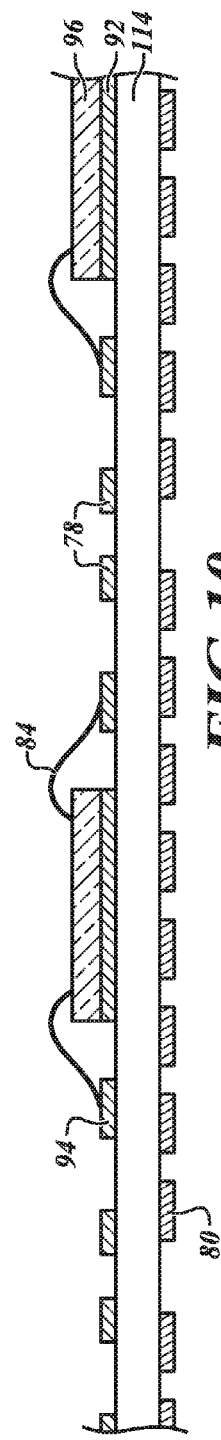

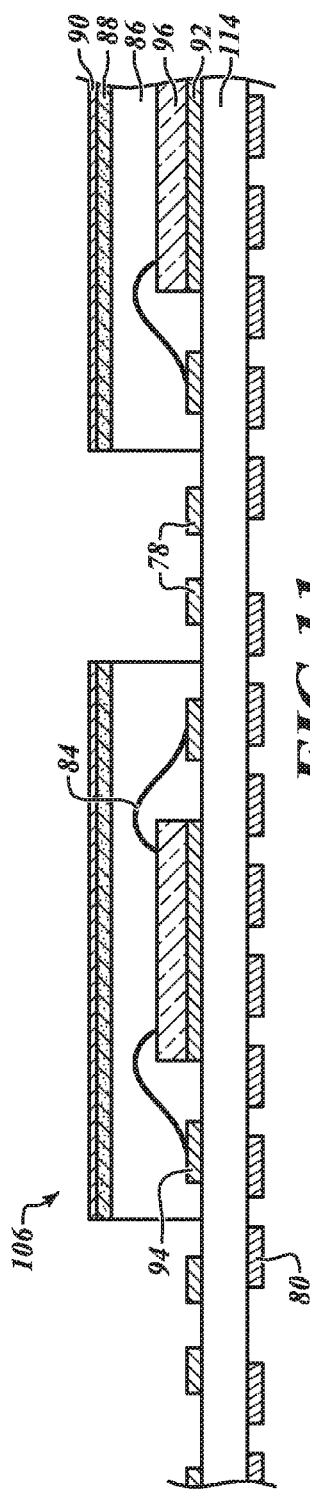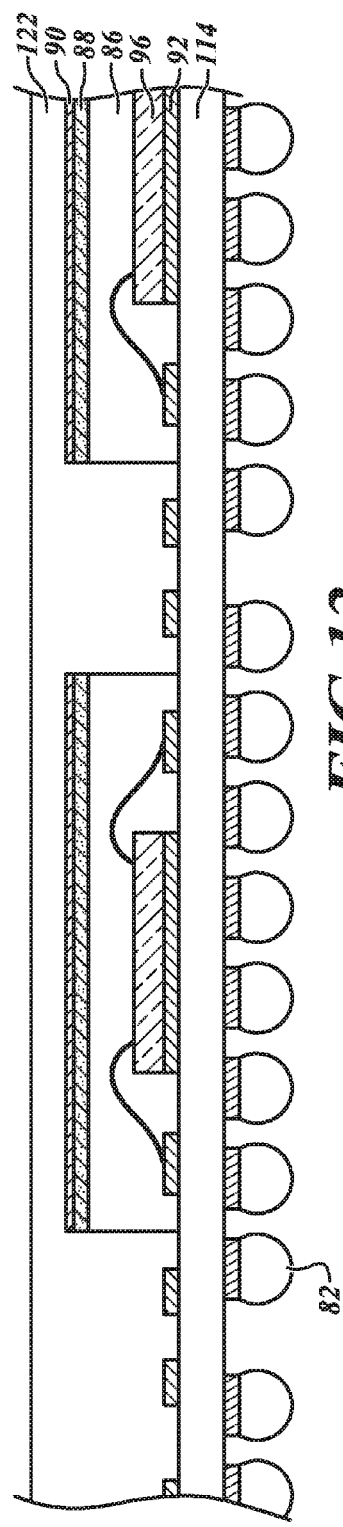

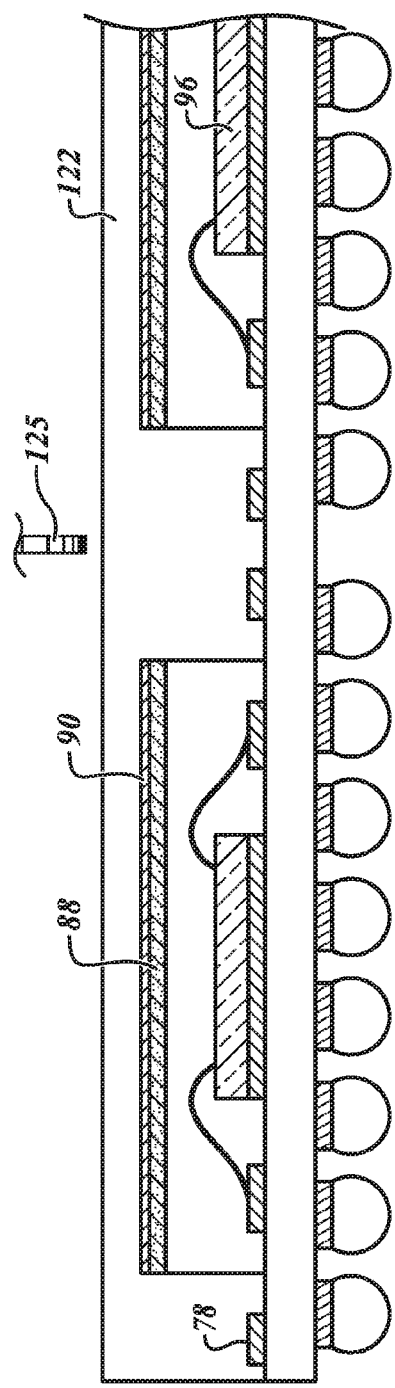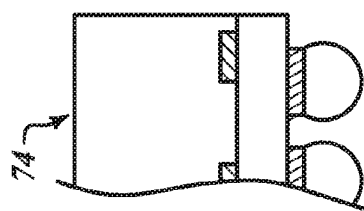
FIG. 13

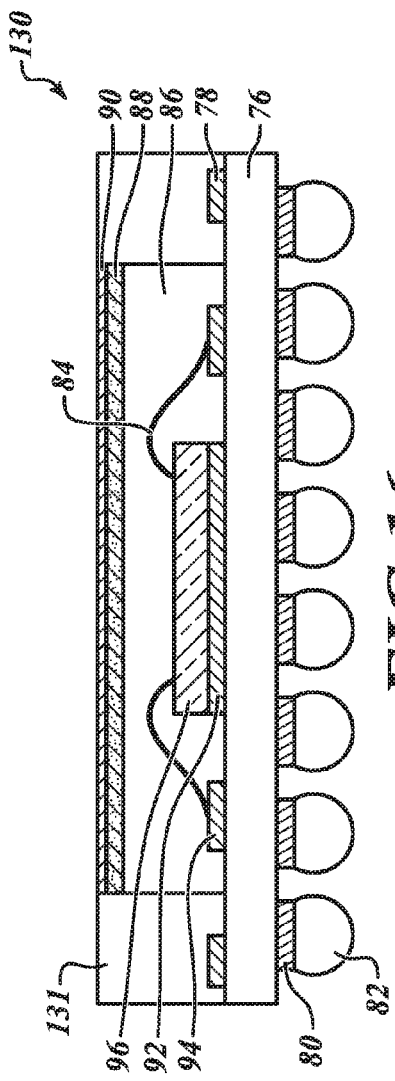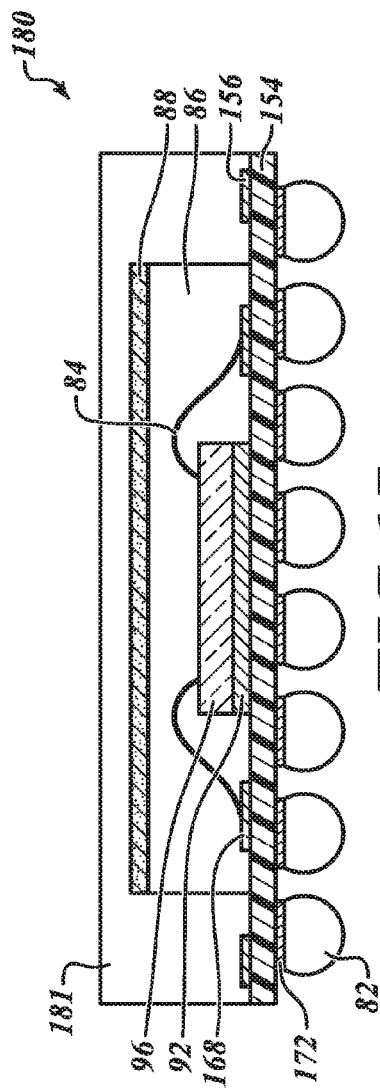

US 9,953,933 B1

FLOW OVER WIRE DIE ATTACH FILM AND CONDUCTIVE MOLDING COMPOUND TO PROVIDE AN ELECTROMAGNETIC INTERFERENCE SHIELD FOR A SEMICONDUCTOR DIE

BACKGROUND

Technical Field

The present disclosure is directed to a package having a substrate, a flow over wire die attach film, a conductive layer on a dummy semiconductor die, and a conductive molding compound overlying the substrate.

Description of the Related Art

As consumer demand increases for thinner packages, manufacturers face significant challenges to form packages thin enough to function within an electronic device. Additionally, as more sensitive electrical components and connections are added to semiconductor packages and electronic devices, manufacturers face significant challenges to reduce exposure to Electromagnetic Interference (EMI) from electrical components in a single electronic device or from an outside environment. Semiconductor packages often include a semiconductor die, electrical connections, and electrical components that need to be protected from EMI. For example, the package may include a non-conductive molding compound or a non-conductive encapsulant to secure elements of the package in a single discrete unit. The package is then coated with a conductive material to form an EMI protective coating.

Other semiconductor packages may include a non-conductive glob top drop material that is formed over the semiconductor die, electrical connections, and electrical components. The non-conductive glob top drop material is then covered by a conductive molding compound or a conductive encapsulant to protect the semiconductor die from EMI.

The above formation techniques are utilized to form packages with EMI protection to protect the semiconductor die and the electrical connections/components within the package from EMI either within an electronic device or from an outside environment. Unfortunately, a package with EMI protection that is formed by a conductive molding compound overlying a glob top drop material results in larger, thicker package. Other difficulties exist as well. First, coating a package with a conductive material may cause undesired electrical connections when forming an EMI protective coating. Second, parts of a package may not be covered when coating the entire outside of a package with a conductive material, which reduces the effectiveness of the EMI protection. Third, a glob top drop material might not fully cover essential electrical connections.

BRIEF SUMMARY

The present disclosure provides semiconductor packages with EMI shields fabricated by utilizing a combination of non-conductive and conductive materials. More specifically, a non-conductive material encases the electrical components of the package, such as a die, contact pads, electrical connections, wires, and the like, and a conductive material covers the non-conductive material to protect the electrical components of the package from EMI. The conductive material is grounded to short any EMI charge to ground without it reaching the electrical components.

According to one embodiment, a package is formed having a substrate, a die, a die attach film overlying the die and an electrically conductive molding compound overlying the die attach film. In this embodiment, a plurality of leads is on a first side of the substrate, and a plurality of conductive pads and an electrically conductive ground terminal are on a second side of the substrate. The electrically conductive ground terminal and conductive pads of the plurality of conductive pads are electrically connected to respective leads of the plurality of leads. The die is attached to the second side of the substrate and wires are formed to couple the die to respective conductive pads of the plurality of conductive pads. The die attach film can be in the form over solid body that is placed onto the substrate. In one embodiment, the die attach film body includes a dummy die having an electrically conductive layer on a top surface thereof, and a first die attach film that is a non-conductive material. The first die attach film of the die attach film body surrounds the plurality of wires and encases the die and the conductive pads. Additionally, the dummy die overlies the first die attach film, the die, the wires, and the plurality of conductive pads. The conductive layer overlies the dummy die. An electrically conductive molding compound is formed to encase the die attach film body and the electrically conductive ground terminal. The electrically conductive molding compound is in electrical contact with the ground terminal and the conductive layer on the dummy die. The electrical contact between the electrically conductive molding compound, the electrically conductive layer of the dummy die, and the electrically conductive ground terminal grounds the entire upper part of the outer layer of the package. This grounding of the electrically conductive molding compound and the electrically conductive layer of the dummy die forms an EMI shield. This EMI shield electrically isolates the die from any external EMI.

This EMI shield has the additional benefit that if the EMI is sufficiently strong that it passes through the electrically conductive molding compound, then the conductive layer of the dummy die acts as a further EMI shield to provide additional protection to dissipate any external EMI.

In one embodiment, the package includes a substrate, a die, a die attach film body, and an electrically conductive molding compound. The die attach film body includes a first die attach film, a non-conductive layer, and a conductive layer. In one alternative, the conductive layer is exposed to an external environment, while in another alternative embodiment, the conductive layer is overlaid by the conductive molding compound.

One goal is to provide a reliable EMI protection that reduces the size of the package, reduces manufacturing costs, and increases the overall percentage of viable packages and semiconductor dies from each manufacturing batch.

BRIEF DESCRIPTION OF THE SEVERAL VIEWS OF THE DRAWINGS

In the drawings, identical reference numbers identify similar elements or acts unless the context indicates otherwise. The sizes and relative positions of elements in the drawings are not necessarily drawn to scale.

FIGS. 4-7 are cross-sectional side views of successive steps of a method of forming a die attach film body according to the embodiments disclosed;

FIGS. 8-13 are cross-sectional side views of successive steps of a method of forming a semiconductor package with an EMI shield according to the embodiments disclosed;

FIG. 16 is a cross-sectional side view of an alternative embodiment of a completed package with an EMI shield;

FIG. 17 is a cross sectional side view of an alternative embodiment of a completed package with an EMI shield.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Figure 1:
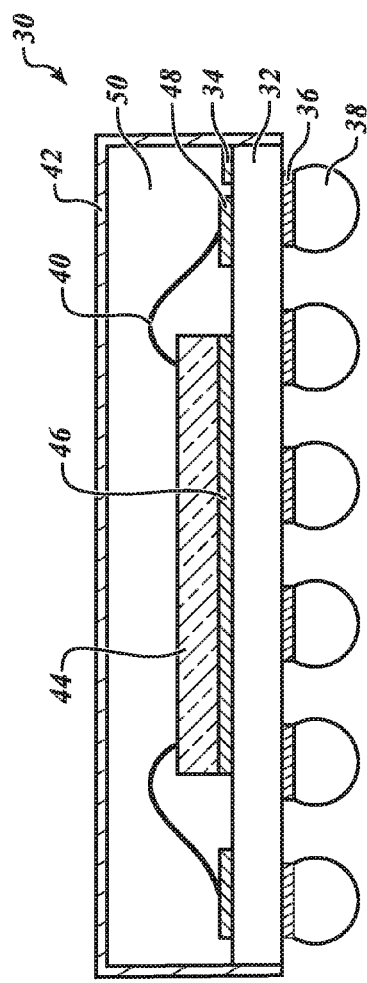
FIG. 1 is a cross-sectional side view of a first prior art semiconductor package with EMI shielding.

FIG. 1 shows a first prior art package 30 including a substrate 32, a ground terminal 34, a plurality of leads 36, a plurality of solder balls 38, a plurality of wires 40, a conductive material 42, a die 44, an adhesive 46, a plurality of contact pads 48, and a non-conductive epoxy molding compound 50.

In this first prior art package 30 embodiment, a substrate 32 is positioned as a base layer during fabrication of the first prior art package 30. The substrate 32 has a first surface and a second surface. The substrate includes a plurality of leads 36 on the second surface of the substrate 32, a ground terminal 34 on the first surface of the substrate 32 and positioned along an edge of the first surface of the substrate 32, and a plurality of contact pads 48 on the first surface of the substrate 32. The substrate 32 has a die 44 coupled to the first surface of the substrate 32. The die 44 is coupled to the first surface of the substrate 32 by an adhesive 46. The die 44 is electrically coupled to the plurality of contact pads 48 by a plurality of wires 40. The substrate 32 contains electrical connections and components for the plurality of contact pads 48 and the ground terminal 34 to be electrically coupled to the plurality of leads 36. A plurality of solder balls 38 may be formed on each respective lead of the plurality of leads 36 for mounting of the first prior art package 30 within an electronic device, such as a phone, a tablet, a computer, a laptop, a calculator, etc. A non-conductive epoxy molding compound 50 is formed on the substrate 32 to encapsulate the plurality of contact pads 48, the plurality of wires 40, and the die 44. In addition, the non-conductive epoxy molding compound 50 must leave exposed at least one side of the ground terminal 34 on the substrate 32.

A conductive material 42 is then sputtered onto the outside of the first prior art package 30. Alternatively, the conductive material 42 may be spray coated or plated onto the first prior art package 30. The conductive material 42 covers all exposed sides of the substrate 32 and the non-conductive epoxy molding compound 50. Furthermore, the conductive material 42 covers the at least one side of the ground terminal 34 on the substrate 32. The conductive material 42 in contact and coupled to the at least one side of the ground terminal 34 acts as an electromagnetic interference (EMI) shield to protect the die from EMI within an electronic device or EMI of an external environment.

Figure 2:
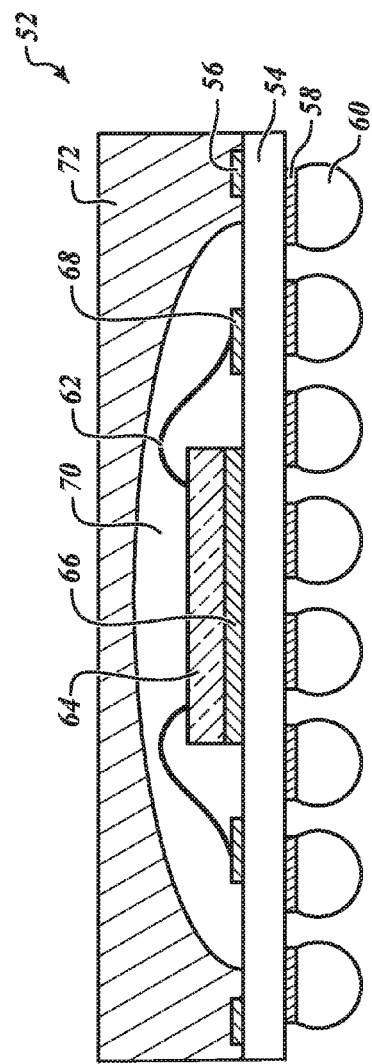
FIG. 2 is a cross-sectional side view of a second prior art semiconductor package with EMI shielding.

FIG. 2 shows a second prior art package 52 that includes a substrate 54, a plurality of ground terminals 56, a plurality of leads 58, a plurality of solder balls 60, a plurality of wires 62, a die 64, an adhesive 66, a plurality of contact pads 68, a non-conductive glob top drop 70, and a conductive epoxy molding compound 72.

In this second prior art package 52 embodiment, a substrate 54 is positioned as a base layer during fabrication of the second prior art package 52. The substrate 54 has a first surface and a second surface. Furthermore, the substrate 54 includes a plurality of leads 58 on the second surface of the substrate 54, a plurality of contact pads 68 on the first surface of the substrate 54, and a plurality of ground terminals 56 on the first surface of the substrate 54. A die 64 is coupled to the substrate 54 by an adhesive 66. Additionally, the die 64 is electrically coupled to the plurality of contact pads 68 by a plurality of wires 62. The substrate 54 contains electrical connections and components for the plurality of contact pads 68 and the plurality of ground terminals 56 to be electrically coupled to the plurality of leads 58. A plurality of solder balls 60 may be formed on the plurality of leads 58 for mounting of the second prior art package 52 within an electronic device, such as a phone, a tablet, a computer, a laptop, a calculator, etc.

A glob top drop 70 is formed to encapsulate the plurality of wires 62, the die 64, the adhesive 66, and the plurality of contact pads 68. Additionally, the glob top drop 70 is made of an electrically non-conductive material. An electrically conductive epoxy molding compound 72 is formed to encapsulate the glob top drop 70 and the plurality of ground terminals 56 on the first surface of the substrate 54. The conductive epoxy molding compound 72 is in contact and coupled to the plurality of ground terminals 56 and acts as an (EMI) shield to protect the die 64 from EMI.

These are two examples of prior art packages that illustrate some of the shortcoming of attempts today to shield die from external EMI.

The present disclosure describes a package that overcomes many of these shortcomings of the prior art. The present disclosure describes various packages with an EMI shield that is formed without spray coating, sputtering, or plating, a package and thus avoids those shortcomings. A package according to the present disclosure provides an EMI shield that is formed by utilizing a non-conductive, flow over wire die attach film. For example, a flow over wire die attach film is an electrically non-conductive material. It becomes malleable (e.g., semi-fluid state) at selected high temperatures or high pressures or a combination of both. Therefore, by heating a substrate with semiconductor dies to a selected high temperature or put under a high pressure or a combination of both with the flow over wire die attach film can encase the die and wires connected to it. The flow over wire die attach film becomes malleable and is placed to overlie, surround and encase the semiconductor dies and the electrical connections and components on the substrate as necessary. The flow over wire die attach film leaves no spaces or gaps between the electrical components or die. Once the flow over wire die attach film is in place, the flow over wire die attach film is removed from the high temperature or high pressure or combination of both to be allowed to cure. Once the curing process is complete, the flow over wire die attach film becomes stiff and is no longer malleable. After this, an electrically conductive molding compound or other encapsulant is placed over the flow over wire die attach film to form the final package and create an EMI shield.

In one embodiment, a dummy semiconductor die of silicon material, which is undoped, that has a layer of an electrically conductive material over it is placed on the die attach film before it is placed on the substrate to form an even stronger EMI shield.

Figure 3:
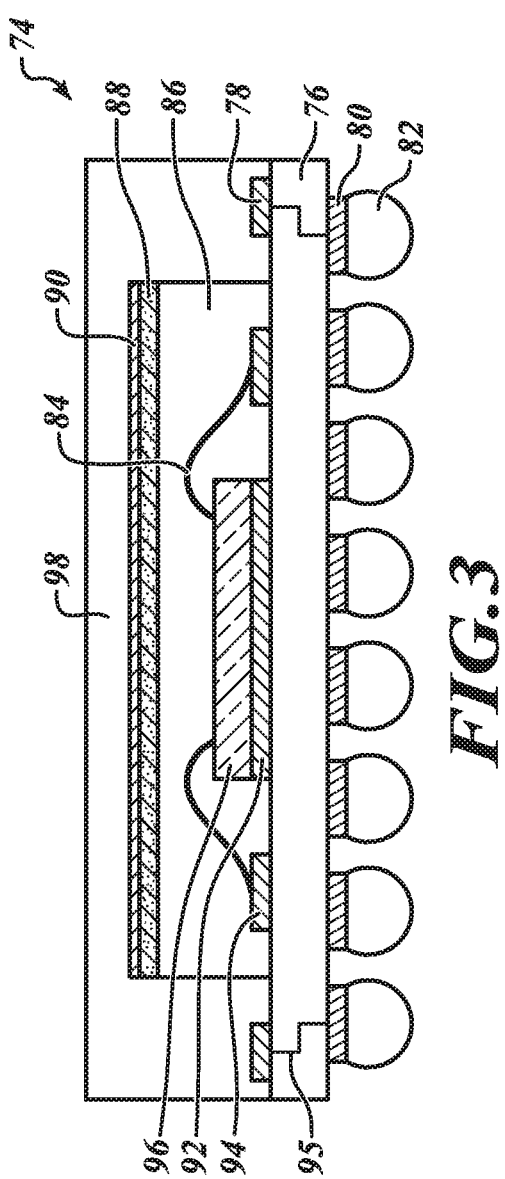
FIG. 3 is a cross-sectional side view of an embodiment of a semiconductor package with the disclosed EMI shield assembly.

FIG. 3 illustrates one embodiment of the present disclosure for providing the EMI protection using a malleable die attach film overlying the die. This embodiment shows a package 74 that is shielded from with an electromagnetic interference (EMI). This package includes a substrate 76, an electrically conductive ground terminal 78, a plurality of leads 80, a plurality of solder balls 82, a plurality of wires 84, a die attach film 86, a dummy die 88, a conductive layer 90, a die adhesive 92, a plurality of conductive pads 94, a die 96, and a conductive molding compound 98.

One acceptable material for the die attached film 86 is a flow over wire die attach film of a type that is well known in the semiconductor industry. One commercial source of this type of flow over wire die attach film is Al Technology, which also uses the logo AiT. AiT offers for sale in the market place today various types of acceptable flow over wire die attach films for the use as described herein. One such die attach film sold by AiT is the ESP7660 FOW series that is thermally conductive but electrically insulating. The term FOW as used by AiT stands for Flow Over Wire in the various die attached films offered for sale by AiT. The ESP7660 FOW series as sold by AiT comes in a variety of different thickness with different flowing properties based on being exposed to different thermal or pressure treatments, as described in the literature provided by AiT. Other products that are accepted are the ESP7665 FOW series and the ESP7666 FOW series of products, which are also products well known in the art, but for uses different from those as described herein. The properties of these various FOW films as sold by AiT, including the temperatures and/or pressures to cause them to be malleable, to induce flow, to perform curing and other properties are described in data sheets provided by AiT to the public and therefore are not repeated herein.

The term Die Attach Film, or DAF refers to a very board group of products that may include pastes, adhesives, glue and any products in the general group that connects a die to a substrate. This term DAF as currently used is a very broad term in the industry and includes many more products than a Flow Over Wire, Die Attach Film, FOW DAF.

In this embodiment, a substrate 76 has a first side and a second side. The first side includes a plurality of leads 80, whereas the second side includes an electrically conductive ground terminal 78 and a plurality of conductive pads 94. The conductive pads of the plurality of conductive pads 94 are electrically conductive. Additionally, the substrate 76 may be a silicon material, a silicon dioxide material, an aluminum oxide material, a sapphire material, a PCB, a polyimide tape, a Kapton material, or some other material that can be used as a substrate known to the semiconductor industry. The substrate 76 contains electrical connections 95 that electrically couple the electrically conductive ground terminal 78 and to ground lead 80. There will be other electrical connections, not shown from the signal and power bonding pads 94 for the die 96 to the respective terminals 80 to which they are connected. A plurality of solder balls 82 may be formed on the plurality of leads 80 for mounting of the package 74 with an EMI shield within an electronic device, such as a phone, a tablet, a computer, a laptop, a calculator, etc.

A die 96 is coupled to the substrate 76 by an adhesive 92. This adhesive 92 can be a standard adhesive of the type used to connect the backside of a die to a substrate, which types are usually electrically conductive to ground the backside of the die 96. The adhesive 92 can be within the broad group of die attach films as previously discussed. In one embodiment, the adhesive 92 may be the same type of material used of the die attach film 86. Of course, it will be thinner and it might be non-conductive material or conductive material. It might be a type of FOW DAF of a type used for the connecting the back sides of die to a substrate as is known in the art.

The die 96 may be any type of semiconductor die. It could be a microprocessor, and ASCI, a sensor that measures any quantity as needed. For example, the die 96 may measure an electronic device's speed, orientation, height, location, etc.

The die 96 is coupled to the plurality of conductive pads 94 by a plurality of wires 84. More specifically, a first end of a respective wire of the plurality of wires 84 is coupled to the die 96 and a second end of the respective wire of the plurality of wires 84 is coupled to a respective conductive pad of the plurality of conductive pads 94.

A first die attach film 86 is utilized to form the electromagnetic interference (EMI) shield of the semiconductor package 74. The first die attach film 86 is an electrically non-conductive material that becomes malleable (e.g., semi-fluid state) at high temperatures or high pressures or a combination of both, as previously explained. For example, the first die attach film 86 is a flow over wire die attach film or a flow over die, die attach film. The first die attach film 86 is utilized to encapsulate, surround, and encase the plurality of wires 84, the adhesive 92, the plurality of conductive pads 94, and the die 96. More specifically, the first die attach film 86 is an electrically non-conductive material that is capable of flowing over the plurality of wires 84 and the die 96 without damaging the plurality of wires 84, the die 96 or electrical connections between the plurality of wires 84, the plurality of conductive pads 94 and the die 96. Furthermore, the first die attach film 86 substantially leaves no gaps or spaces between any of the wires 84, the substrate 76, the plurality of conductive pads 94, and the die 96. A dummy die 88, which acts as an electrical isolation layer, is coupled to the first die attach film 86, overlying it, the die 96, the plurality of wires 84, the substrate 76, and the plurality of conductive pads 94. The dummy die 88 may be a non-conductive and rigid material such as silicon. More specifically, the dummy die 88 may be a thin silicon wafer that has no active components and is an undoped, intrinsic silicon. It might be slightly p type doped since intrinsic silicon has a very light n type concentration so that a very light p type doping makes it even less conductive. The dummy die 88 may be some other non-conductive and rigid material. A conductive layer 90 is coupled to the dummy die 88 to form an EMI shield directly above the die 96. The conductive layer 90 may be an aluminum layer, a copper layer, a nickel-palladium layer, a silver layer, a gold layer, or some other combination of electrically conductive materials.

A conductive molding compound 98 is formed to encapsulate the die attach film 86, the adhesive 92, the dummy die 88, the conductive layer 90, and the electrically conductive ground terminal 78 on the substrate 76. The conductive molding compound 98 is coupled to the conductive layer 90. Furthermore, the conductive layer 90 and the conductive molding compound 98 are grounded by the electrically conductive ground terminal 78 on the substrate 76. In turn, the conductive molding compound 98, the conductive layer 90 and the electrically conductive ground terminal 78 form an EMI shield to protect the die 96, the plurality of wires 84, and the plurality of conductive pads 94 in the package 74 from EMI that comes from outside package 74 environment.

Utilizing a die attach film 86, which is an electrically non-conductive flow over wire die attach film that becomes malleable at high temperatures or high pressures or a combination of both, a dummy die 88 of electrically non-conductive material, a conductive layer 90 of electrically conductive material, and an electrically conductive molding compound 98 forms a package with an EMI shield. In addition, utilizing the die attach film 86 to encapsulate the delicate electrical components 84, 94, 96 of a package 74 reduces the chances of short circuiting due to non-coverage of the delicate electrical components 84, 94, 96 of the package 74. This is because the first die attach film 86 is placed and shaped more accurately than a glob top drop material. For example, a glob top drop, which is in a fluid state, has a greater chance of not properly covering the delicate electrical components 84, 94, 96 due to external stresses such as vibration, air pockets, etc. In addition, the glob top drop, which is in a fluid state, may spread so far as to cover ground terminals 56 of a package. If the glob top covers one or more of the ground terminals 56, then the conductive molding compound is not grounded with a solid, very low resistance connection and might not form and effective EMI shield. The die attach film 86, unlike the glob top drop, is malleable at high pressures, high temperatures or a combination of both, allowing the die attach film 86 to maintain its shape while covering the delicate electrical components 84, 94, 96. Additionally, even die attach film 86 becomes too fluid and flows sufficiently to expose the wires 84, the dummy die 88 of non-conductive material would contact the plurality of wires 84. This dummy die 88 is non-conductive and serve to prevent the conductive molding compound from touching the wires 84. Further, the die attach film 86 is affixed to the dummy die 88. If the die attach film 86 flows sufficiently low that the dummy die 88 touches the top edge of the wires 84, the dummy die will stop moving at this stage and be suspended by the wires 84, which will hold the die attach film 86 in place and keep it from moving and additional distance. This will prevent the package 74 from short circuiting even when the plurality of wires 84 might otherwise be exposed at the top surface or edge.

Utilizing a die attach film 86, which is an electrically non-conductive flow over wire die attach film that becomes malleable at high temperatures or high pressures or a combination of both, allows for thinner packages 74 to be produced. Thinner packages 74 are produced because, unlike a glob top drop, the height of the die attach film 86 is closer to the height of wires 84 in a package 74 due to the die attach film 86 maintaining its shape when being formed over and embedding delicate electrical components 84, 94, 96. As a result, less molding compound will be utilized to finish packages 74, 128, 130, 180 (see FIGS. 14, 15, 16 and 17), thus allowing for packages with EMI shields to be produced for lesser cost, with fewer defects, and with thinner profiles. A thin, low height profile package is desired in many applications because thin electronic devices, such as watches, wearable electronics and other extremely thin devices are now being provided in the market place. Furthermore, these chips that are in watches, wearable electronics, eyeglasses, shoes, and the like are more likely to be exposed to a large number of various EMI pulses as compared to chips in a housing surrounded by a metal case, such as a phone, tablet or portable computer. Thus, providing reliable EMI protection in very thin packages has a number of commercial advantageous.

FIGS. 4-7 illustrate the steps in making individual and singulated die attach film bodies 106. The die attach film bodies 106 each include a die attach film 86, a dummy die 88, and an electrically conductive layer 90. FIG. 4 is a cross-sectional side view of a dummy wafer 100. The dummy wafer 100 is a large wafer that includes what will become many hundreds or thousands of individual dummy die. The dummy wafer 100 may be a wafer of non-conductive material, such as a thin silicon undoped wafer with no active surfaces. Alternately, the dummy wafer 100 may be slightly doped p type since that will be even less conductive than intrinsic, undoped silicon. The dummy wafer can also be quartz, sapphire, glass, carbon or any other rigid, body on which a conductor can be formed. In other embodiments, the dummy wafer is a highly conductive material, such as a heavily n or p type doped silicon. Any rigid member that can easily be provided with a top conductive layer could be used for the dummy wafer and thus for the dummy die.

The end goal is for the dummy die, and thus the dummy wafer, to have a conductive top surface that will block, by trapping or grounding out, all EMI pulses. Therefore, if the entire dummy wafer is conductive, that is acceptable. The use of silicon for the dummy wafer, whether doped or undoped is convenient and low cost. The packaging process for semiconductor die is well developed for handling silicon wafers and die. Thus, the use of silicon for the dummy wafer and die fit smoothly into the current process flow without having to modify the machinery, temperatures or other parts of the process. The use of silicon for the dummy wafer is therefore preferred in the current process flow. The dummy wafer 100 may be polished and cleaned on both sides to form uniform and flat surfaces on the dummy wafer 100.

Alternatively, the dummy wafer 100 may be only polished on one side, or the dummy wafer 100 may not be polished at all.

FIG. 5 shows a cross-sectional side view of one surface of the dummy wafer 100 being covered by a conductive material 102. The conductive material is a thin and electrically conductive material such as copper, aluminum, gold, silver, nickel-palladium, or any other electrically conductive metal, material, or combination thereof. A preferred material for conductor is an aluminum alloy that contains small amounts of silicon, such as about 98% Al and 1-2% Si, with other minor elements. The conductive material 102 may be formed by blanket deposition, such as by sputtering, plating, spray coating, chemical vapor disposition (CVD), or any other formation technique known to the semiconductor industry for forming a thin layer of conductive material on a substrate. Furthermore, after the conductive material 102 is formed on the dummy wafer 100, the dummy wafer may be polished or grinded down on the side without the conductive material 102 to reduce the thickness of the dummy wafer 100. In most embodiments, the conductive layer 102 is applied while the dummy wafer 100 is quite thick so that the deposition can be performed with standard silicon processing equipment. Then, after the layer 102 is deposited, the backside is polished so that the wafer 100 becomes very thin, as shown in FIG. 5.

FIG. 6 shows a cross-sectional side view of a conductive material 102 on a first surface of a dummy wafer 100 and a die attach film, sometimes called a DAF, layer 104, which is an electrically non-conductive flow over wire die attach film that becomes malleable (e.g., semi-fluid state) at high temperatures or high pressures or a combination of both. This die attach film 104 is provided as a large wafer having about the same diameter as the wafer 100. The die attach film wafer is coupled to a second surface of the dummy wafer that is opposite to the first surface of the dummy wafer 100 with the conductive material 102. Depending on the type of die attach film used, the die attach film layer 104 can be partially cured at this stage to make it slightly more rigid and to firmly attach it to the wafer 100. If needed, an adhesive can be applied between the wafer 100 and the die attach film 104 to fix them to each other. Once the die attach film is attached to the back side of the wafer 100, they become a single large wafer that will later be singulated into separate units 106. There are a number of materials that can used for the die attach film wafer 104 that will strongly adhere to silicon, many of which were previously discussed and are available under the name of FOW DAF, and one company that sells such die attach film wafers is AiT.

FIG. 7 shows a cross-sectional side view of a die attach film die attach film body 106 being singulated. The die attach film body 106 is formed by utilizing a cutting device 103 to dice the dummy wafer 100, the conductive material 102, and the die attach film layer 104 combination into singulated, individual die attach film bodies 106. The individual die attach film bodies 106 include a die attach film 86, a dummy die 88, and a conductive layer 90. The cutting device 103 may be a blade, a saw, a laser etch, or any other cutting device or technique known to the semiconductor industry for cutting wafers of this type.

FIGS. 8-13 illustrate the steps to form one embodiment of a package 74 (see FIG. 14) with an EMI shield. FIG. 8 shows a cross-sectional side view of a substrate layer 114 including electrically conductive ground terminals 78 on a first surface of the substrate layer 114, a plurality of conductive pads 94 on the first surface of the substrate layer 114, and a plurality of leads 80 on a second surface of the substrate layer 114. The substrate layer 114 may be a PCB, a polyimide material, a Kapton material or some other substrate material known to the semiconductor industry. In addition, the substrate layer 114 has electrical connections and components extending though it from the top side to the bottom side that electrically couple the electrically conductive ground terminals 78 and the plurality of conductive pads 94 to respective ones of the plurality of leads 80. The formation of a substrate having conductive pads and terminals on each side with internal electrical connections between them is well known in the art and therefore is not further described here.

FIG. 9 shows a cross-sectional side view of an adhesive 92 and a die 96 coupled to the substrate layer 114. The die 96 is coupled to the first surface of the substrate layer 114 by an adhesive 92 of any acceptable type, in some cases, it will be second die attach film. In this way, the die 96 is coupled to the substrate layer 114 and may be between the plurality of conductive pads 94 and the electrically conductive ground terminals 78. The die 96 may be any die for desired purpose, such a memory, ASCI, processor, sensor or the like. In addition, the adhesive 92 may be a conductive material or a non-conductive material. If the adhesive 92 is a conductive material, it may electrically couple the die 96 to ground or other electrical connections and components of the substrate layer 114.

FIG. 10 shows a cross-sectional side view of a plurality of wires 84 coupling the die 96 to the plurality of conductive pads 94. In particular, a first end of a respective wire of the plurality of wires 84 is coupled to a respective conductive pad of the plurality of conductive pads 94, and a second end of the respective wire is coupled to the die 96. The plurality of wires 84 may be formed by wire bonding or some other technique known to the semiconductor industry. In one embodiment, wires 84 are not used. If it is desired to have an ultrathin package 74, which might be the case with package 180 of FIG. 17, then the die 96 might be connected by a flip chip technique in which the active surface of the die 96 is face down, in contact with the substrate 114. The bond pads on the die may directly contact the leads 94, making the profile even thinner since no wires will be above the top surface. In this flip chip embodiment, the dummy die might have its back side surface directly abutting the backside of the die or it might be separate by the die attach film 86.

FIG. 11 shows a cross-sectional side view of a die attach film body 106 including a first die attach film 86, a dummy die 88, and a conductive layer 90 being placed overlying each die on the substrate 114. The die attach film 86 of the die attach film body 106 is a flow over wire die attach film that becomes malleable at high temperatures, high pressures or a combination of both. The first die attach film 86 of the die attach film body 106 (see FIGS. 4-7) is placed to overlie the plurality of electrically conductive pads 94, the plurality of wires 84, and the die 96. More specifically, the first die attach film 86 surrounds the plurality of wires 84 and encases the die 96 and the conductive pads 94. Furthermore, the first die attach film 86 is coupled to the substrate layer 114. The die attach film body 106 is placed under either a high pressure or a high temperature or both to allow for the first die attach film 86 to become malleable. While the first die attach film 86 is at a point in which it is malleable enough to easily flow over the plurality of conductive pads 94, the die 96, and the plurality of wires 84, the die attach film body 106 on the substrate layer 114 over the plurality of conductive pads 94, the second die attach film 92, the die 96, and the plurality of wires 84, it is permitted to fully encase the die 96 and the wires 84 connected to it as shown in FIG. 11. After the die attach film body 106 has been placed, the die attach film body 106 is either allowed to cool off, is exposed to a lower pressure or both. By removing the die attach film body 106 from high heat or high pressure, the first die attach film 86 begins to stiffen and become rigid. The first die attach film 86 of the die attach film body 106 is fully cured by any acceptable technique. For example, it can be allowed to fully cure by cooling or by applying UV light or other known methods. After it is fully cured, it will overlie, surround, and encase the plurality of conductive pads 94, the die 96, and the plurality of wires 84. After the first die attach film 86 of the die attach film body 106 has been fully cured, it becomes rigid and stiff and no longer malleable. FIG. 12 shows a cross-sectional side view of a conductive molding compound layer 122 overlying, encasing and embedding the die attach film body 106 and the electrically conductive ground terminals 78. The conductive molding compound layer 122 is electrically conductive. The conductive molding compound layer 122 is formed to be in electrical contact with the conductive material 102 of the die attach film body 106 and the electrically conductive ground terminals 78. In addition, the electrically conductive molding compound layer 122 and the conductive layer 90 of the die attach film body 106 are electrically grounded by the electrically conductive ground terminals 78 on the substrate layer 114. Also, a plurality of solder balls 82 may be formed on respective ones of the plurality of leads 80. The plurality of solder balls 82 allow for mounting of the packages within electronic devices, such as a laptop, a tablet, a computer, a calculator, a phone, etc.

FIG. 13 shows a cross-sectional side view of a singulation process of individual packages 74 with an EMI shield. A cutting device 125 is used to singulate the individual packages 74. The cutting device 125 may be a blade, a laser, a saw, or some other cutting device known to the semiconductor industry for package singulation.

Figure 14:
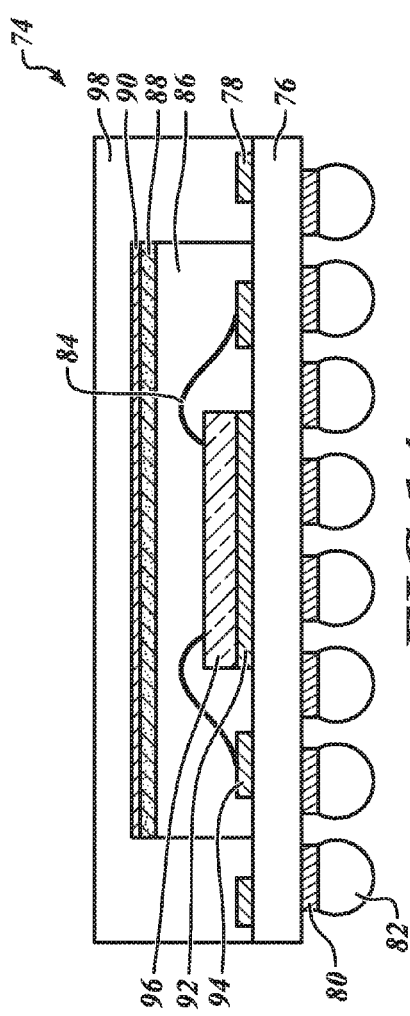
FIG. 14 is a cross-sectional side view of a final package as in FIG. 3 with an EMI shield made according to the methods shown and described by FIGS. 4-13.

FIG. 14 shows a cross-sectional side view of a singulated and finished package 74 with an EMI shield and is a reproduction of FIG. 3, placed here to show the product that results from the steps of FIGS. 4-13, all combined. The EMI shield includes the conductive layer 90, the conductive molding compound 98, and the electrically conductive ground terminal 78. The EMI shield absorbs or blocks electromagnetic interference (EMI) from electrical components within the package. Namely, if an EMI event originates within the package 74, the EMI shield will keep it encased fully within the package 74 itself. In many cases, the die 96 is a sensor die and thus might create an EMI pulse depending on the type of die and the event being sensed. The EMI shield is also effective to block an EMI that originates outside of the package 74.

Figure 15:
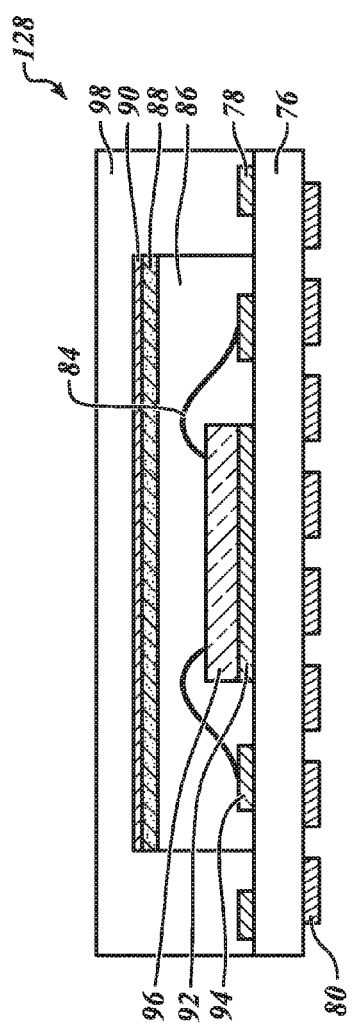
FIG. 15 is a cross-sectional side view of an alternative embodiment of a completed package with an EMI shield.

FIG. 15 is an alternative embodiment of a singulated and finished package 128 with an EMI shield. Unlike the embodiment in FIG. 14, this alternative embodiment of the singulated and finished package 128 does not have the optional plurality of solder balls 82. Instead, the plurality of leads 80 can be any type of acceptable lead for any finished package 128. The package 128 can be any Surface Mount Device (SMD), such as a Quad Flat Pack (QFP) a Quad Flat No-Leads (QFN), LGA, or any acceptable SMD. It can also be a SIP, DIP, or any acceptable extended lead package, through-hole type package. It can be in any type of chip carrier package, a pin grid array, a ball grid array, a flat package, a small outline package or any type of semiconductor package in which shielding from EMI is desired. It is particularly useful in extra thin packages, for example, of the type that will be used in wearable electronics. Thus, the leads 80 are to be considered as generic leads that can be used in any type of package.

FIG. 16 is another alternative embodiment of a singulated and finished package 130 with an EMI shield. Different from the embodiments in FIGS. 13 and 14, in this alternative embodiment, the conductive layer 90 is exposed to the outside environment. The conductive layer 90 is in electrical contact with a conductive molding compound 131 at the edges. The conductive molding compound 131 is in electrical contact with the electrically conductive ground terminal 78. By exposing the conductive layer 90 of the EMI shield and not having it covered with the molding compound 131, the singulated and finished package 130 may be made even thinner than the earlier alternative embodiments. The conductive layer 90 may be exposed by grinding down the conductive molding compound 131 that is formed on the conductive layer 90, or the conductive molding compound 131 may only be formed within the spaces between the die attach film bodies 106 as seen in FIG. 11 so as to not cover the conductive layer 90.

FIG. 17 is another alternative embodiment of a singulated and finished package 180 with an EMI shield. However, unlike the alternative embodiment in FIG. 16, in this alternative embodiment, a conductive molding compound 181 is thinner at the top and there is no conductive layer 90 overlying the dummy die 88. This shows how singulated and finished packages 74, 128, 130, 180 may be made thinner or thicker depending on the package's application. Also, unlike the other embodiments, in this embodiment a polyimide tape or a Kapton material has been utilized as a substrate 154.

The advantage of utilizing a Kapton material as the substrate 154 is that it allows a package 180 to be manufactured thinner than when utilizing a PCB or a fiberglass based substrate. As can be seen in FIG. 17, the layer 154 is thinner than the layer 76. FIG. 17 is not to scale in all embodiments, for example, in one embodiment; layer 17 will be thinner than the die 96. Further no solder balls are present. In addition, a plurality of leads 172, a plurality of electrically conductive pads 168, and an electrically conductive ground terminal 156 may be thinner when utilizing a Kapton material as the substrate 154. Thus, utilizing a Kapton material allows for packages 180 to be made even thinner than other alternative embodiments of packages 74, 128, 130 disclosed. It also permits the entire package 180 to be very flexible, which is beneficial when using in clothing for wearing.

Figure 18:
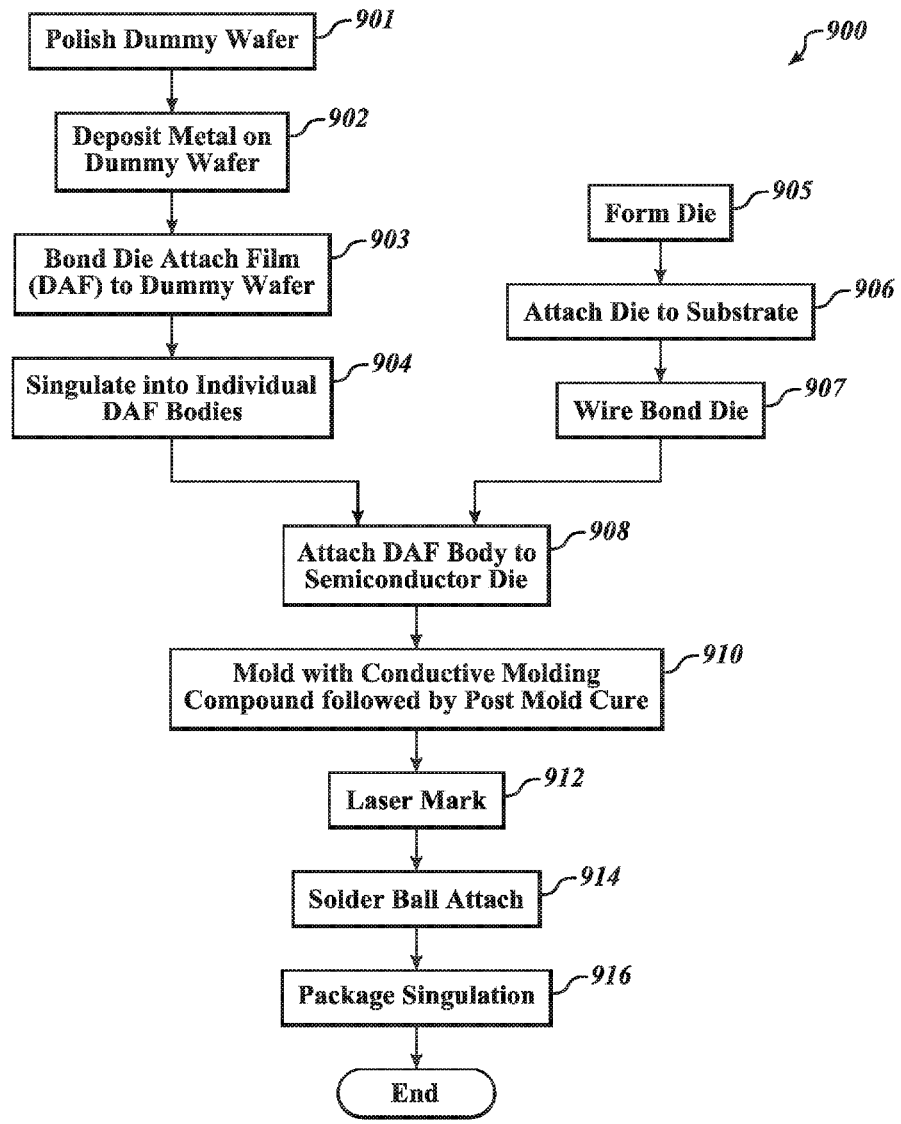
FIG. 18 is a flow chart diagram of successive steps of a package with an EMI shield fabrication process according to FIGS. 4-13.

FIG. 18 shows a flow chart diagram of successive steps of a package with an EMI shield fabrication process according to FIGS. 4-13. More specifically, FIG. 18 shows a flow chart diagram summarizing a method of manufacturing of hundreds, thousands, or any number of packages with EMI shields in a single batch process.

In the process the die attach body and the die progress on different assembly steps and then are joined into a single package part way through the process. The method of manufacturing includes making the individual die attach bodies 106. One step is to polish dummy wafer 901 and another step is to deposit metal on the dummy wafer 902. These two steps can be reversed in their order and performed in different sequence with the deposition 902 occurring first and the thinning 901 afterwards. Or, there can be a first thinning 901, then a metal deposition 902, then a second thinning 901. The metal deposition can be left out if desired, particularly if the dummy die is electrically conductive. After this, the die attach film is coupled to Dummy Wafer, step 903. When the dummy die attach wafer is fully completed, then the dummy die are singulated into individual die attach film bodies 106 in step 904. On a separate track, in a different location, the die 96 are formed, step 905. This is followed by attaching the die to substrate, step 906, then it is electrically connected by any acceptable method to the substrate, such as a wire bonding step 907.

The method of manufacturing 900 begins with two different processes: (1) The process of manufacturing die attach film bodies 106 as shown in FIGS. 4-7, and (2) the process of manufacturing multiple die 96 on a substrate as shown in FIGS. 8-10. The process of manufacturing die attach film bodies 106 includes the steps 901-904. The polish dummy wafer 901 step corresponds to FIG. 4. In the polish dummy wafer 901 step, a dummy wafer 100 is polished to make the dummy wafer 100 thin and have flat uniform surfaces. A conductive material 102 is deposited onto one side of the dummy wafer 100 in the deposit metal on dummy wafer 902 step. The deposit metal on dummy Wafer 902 step is shown having been completed in FIG. 5. After the deposit metal on dummy wafer 902 step, a die attach film layer 104 is attached to the dummy wafer 100, 903 step, which has been completed in to FIG. 6. Then the dummy wafer 100, the conductive material 102, and the die attach film layer 104 are singulated into individual packages in the singulated step 904, which corresponds to FIG. 7. The result of this process is individual die attach film bodies 106 as seen in FIG. 7 that include a conductive layer 90, a dummy die 88, and a first die attach film 86, which is an electrically non-conductive flow over wire die attach film.

The process of manufacturing multiple die on a substrate includes the forming the die, step 905, attaching the die to a substrate, step 906, and then electrically connecting the die to the substrate, step 907, by any acceptable technique, one of which is wire bonding. Attaching the die to substrate of 906 step is shown completed in FIG. 9. It is electrically connected in step 907, as shown in FIG. 10.

Once the two above processes are complete, (1) the process of manufacturing die attach film bodies 106 as shown in FIGS. 4-7, and (2) the process of manufacturing multiple die on a substrate as shown in FIGS. 8-10, the die attach film bodies 106 and the die 96, substrate layer 114, and plurality of wires 84 are combined to form a large array of die on a large substrate. The die attach film body 106 is connected to the substrate as shown in FIG. 11.

A molding compound is applied to the substrate layer 114 in step 910, FIG. 12.

After encapsulating logos, ID codes or other marks are formed on the molding compound layer 122 in the marking step 912, as is known in the art. The marking step 912 can be done with ink, silk screen or any technique. This step 912 is optional and may be done after package singulation or by another party completely.

A plurality of solder balls 82 are attached to a plurality of leads 80 on the substrate layer 114 in step 914, but this is optional. The solder ball attach may be done after package singulation or after shipment to another party to avoid defects in solder balls. As a final step, the individual packages are singulated, step 916 which corresponds to FIG. 13.

By utilizing the method disclosed above, individual packages with EMI shields are manufactured in batches of hundreds, thousands, or any number as needed. Also, individual packages with EMI shields are manufactured with fewer defects and with less waste material. In addition, the EMI shields within the packages have two layers of conductive material: (1) an electrically conductive molding compound, and (2) a conductive layer. This two conductive layer combination creates a stronger EMI shield, allows for packages to be manufactured thinner, and allows packages to be made with less waste such as defective packages or use of excess conductive material.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor package, comprising:
   a substrate having a first side and a second side;
   a plurality of leads on the first side of the substrate;
   an electrically conductive ground terminal on the second side of the substrate, the electrically conductive ground terminal being electrically connected to a respective lead of the plurality of leads;
   a plurality of conductive pads on the second side of the substrate;
   a die coupled to the second side of the substrate;
   a plurality of wires, each wire having a first end coupled to the die and a second end coupled to a respective conductive pad of the plurality of conductive pads;
   a first die attach film overlying the die, the plurality of conductive pads, and the plurality of wires, the first die attach film surrounding the plurality of wires and encasing the die and the conductive pads, the first die attach film being coupled to the substrate;
   an electrical isolation layer overlying the first die attach film;
   a conductive layer in direct contact with and overlying the electrical isolation layer; and
   an electrically conductive molding compound overlying the substrate, the electrically conductive ground terminal, the first die attach film, the die, the electrical isolation layer, and the conductive layer, the electrically conductive molding compound coupling the electrically conductive ground terminal to the conductive layer.

2. The semiconductor package of claim 1, further including a plurality of solder balls having each solder ball coupled to a respective lead of the plurality of leads.

3. The semiconductor package of claim 1, wherein the electrical isolation layer is a dummy die.

4. The semiconductor package of claim 3, wherein the dummy die is an undoped dummy semiconductor die.

5. The semiconductor package of claim 1, wherein each conductive pad of the plurality of conductive pads on the second side of the substrate is electrically coupled to a respective lead of the plurality of leads on the first side of the substrate.

6. The semiconductor package of claim 1, further including a second die attach film coupling the die to the second side of the substrate.

7. The semiconductor package of claim 1, wherein the electrical isolation layer overlying the first die attach film is a silicon material.

8. The semiconductor package of claim 1, wherein the conductive layer in direct contact with and overlying the electrical isolation layer is an electrically conductive material.

9. The semiconductor package of claim 8, wherein the electrically conductive material is an aluminum material deposited on the electrical isolation layer.

10. The semiconductor package of claim 1, wherein the first die attach film is an electrically non-conductive material and a flow over wire die attach film.

11. A semiconductor package, comprising:
a substrate having a die attach surface and a non-die attach surface;
a plurality of leads on the non-die attach surface of the substrate;
an electrically conductive ground terminal on the die attach surface of the substrate, the electrically conductive ground terminal being electrically connected to a respective lead of the plurality of leads;
a plurality of electrically conductive pads on the die attach surface of the substrate;
a die coupled to the die attach surface of the substrate by a die attach film;
a plurality of wire bond interconnects, each wire bond interconnect having a first end coupled to the die and a second end coupled to a respective electrically conductive pad of the plurality of electrically conductive pads;
a non-conductive die attach film overlying the substrate, the die, the plurality of electrically conductive pads, and the plurality of wire bond interconnects, the non-conductive die attach film being coupled to the substrate, the non-conductive die attach film surrounding the plurality of wire bond interconnects and encasing the die and the plurality of electrically conductive pads;
a non-conductive layer overlying the non-conductive die attach film; and
an electrically conductive encapsulant overlying the substrate and the electrically conductive ground terminal, the electrically conductive encapsulant covering sides of the non-conductive die attach film, the non-conductive layer, and the electrically conductive ground terminal.

12. The semiconductor package of claim 11, further including an electromagnetic interference (EMI) shield layer overlying and in direct physical contact with the non-conductive layer.

13. The semiconductor package of claim 12, wherein the electrically conductive encapsulant overlies the non-conductive die attach film, the die, the non-conductive layer, and the EMI shield layer.

14. The semiconductor package of claim 13, wherein the EMI shield layer is an electrically conductive material coupled to the non-conductive layer and the electrically conductive encapsulant.

15. The semiconductor package of claim 14, wherein the conductive material deposited on the non-conductive layer is an aluminum material.

16. The semiconductor package of claim 12, wherein the EMI shield layer is exposed, is an electrically conductive material, and is coupled to the non-conductive layer and the electrically conductive encapsulant.

17. The semiconductor package of claim 11, wherein the electrically conductive encapsulant is coupled to the substrate.

18. The semiconductor package of claim 11, further including a plurality of solder balls having each solder ball coupled to a respective lead of the plurality of leads.

19. The semiconductor package of claim 11, wherein the non-conductive layer is a dummy undoped semiconductor die.

* * * * *